(12) United States Patent
Suzuki

(10) Patent No.: US 10,916,631 B2
(45) Date of Patent: Feb. 9, 2021

(54) SEMICONDUCTOR DEVICE INCLUDING AN N-TYPE CARRIER STORED LAYER, POWER CONVERSION DEVICE, AND METHOD OF MANUFACTURING THE SEMICONDUCTOR DEVICE

(71) Applicant: Mitsubishi Electric Corporation, Tokyo (JP)

(72) Inventor: Kenji Suzuki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 139 days.

(21) Appl. No.: 16/108,114

(22) Filed: Aug. 22, 2018

(65) Prior Publication Data

US 2019/0237545 A1 Aug. 1, 2019

(30) Foreign Application Priority Data

Jan. 31, 2018 (JP) .................................. 2018-015163

(51) Int. Cl.
*H01L 29/10* (2006.01)
*H01L 29/66* (2006.01)
*H01L 29/739* (2006.01)

(52) U.S. Cl.
CPC .... *H01L 29/1095* (2013.01); *H01L 29/66333* (2013.01); *H01L 29/7394* (2013.01); *H01L 29/7397* (2013.01)

(58) Field of Classification Search
CPC ........... H01L 29/1095; H01L 29/66333; H01L 29/7397; H01L 29/0615; H01L 29/407; H01L 29/66348; H01L 29/4236; H01L 29/7395; H01L 29/41708; H01L 29/0821;
(Continued)

(56) References Cited

U.S. PATENT DOCUMENTS

2004/0041171 A1 3/2004 Ogura et al.
2007/0267663 A1* 11/2007 Harada ............... H01L 29/7397
257/288

(Continued)

FOREIGN PATENT DOCUMENTS

| JP | 2001-127286 A | 5/2001 |
|---|---|---|
| JP | 2004-022941 A | 1/2004 |
| JP | 2007-311627 A | 11/2007 |

*Primary Examiner* — Khiem D Nguyen
(74) *Attorney, Agent, or Firm* — Studebaker & Brackett PC

(57) ABSTRACT

A semiconductor device includes: an n-type semiconductor substrate; a p-type base layer formed on a surface of the n-type semiconductor substrate; an n-type emitter layer formed on the p-type base layer, a trench gate penetrating through the p-type base layer and the n-type emitter layer; an n-type carrier stored layer formed between the n-type semiconductor substrate and the p-type base layer and having a higher concentration than that of the n-type semiconductor substrate; and a p-type collector layer formed on a back surface of the n-type semiconductor substrate, wherein with respect to the n-type carrier stored layer, a concentration gradient directing from a position of a peak concentration to the back surface of the n-type semiconductor substrate is larger than a concentration gradient directing from the position of the peak concentration to the p-type base layer, and a proton is implanted in the n-type carrier stored layer as an impurity.

9 Claims, 8 Drawing Sheets

(58) Field of Classification Search
CPC ............. H01L 29/1004; H01L 29/0804; H01L 29/7393
See application file for complete search history.

(56) References Cited

U.S. PATENT DOCUMENTS

| | | | |
|---|---|---|---|
| 2016/0065081 A1* | 3/2016 | Raju | H02M 3/33569 |
| | | | 363/21.1 |
| 2016/0260703 A1* | 9/2016 | Nakamura | H01L 29/407 |
| 2017/0047408 A1* | 2/2017 | Kuribayashi | H01L 21/02529 |
| 2017/0309704 A1* | 10/2017 | Suzuki | H01L 29/0696 |
| 2018/0145147 A1* | 5/2018 | Omura | H01L 29/4916 |

* cited by examiner

SEMICONDUCTOR DEVICE INCLUDING AN N-TYPE CARRIER STORED LAYER, POWER CONVERSION DEVICE, AND METHOD OF MANUFACTURING THE SEMICONDUCTOR DEVICE

BACKGROUND OF THE INVENTION

Field

The present invention relates to a semiconductor device, a power conversion device, and a method of manufacturing a semiconductor device.

Background

From the viewpoint of energy saving, insulated gate bipolar transistors (IGBTs) have been used as power modules each performing variable speed control of a three-phase motor, etc. in fields of general-purpose inverter/AC servos, etc. There is a trade-off relationship between switching loss/on-voltage and SOA (Safe Operating Area) in IGBTs. However, devices having low switching loss/on-voltage and wide SOA have been required.

Most of the on-voltage is influenced by the resistance of a thick n$^-$-type semiconductor substrate necessary to hold a withstand voltage. In order to reduce the resistance, it is effective to store holes from the back surface in the n$^-$-type semiconductor substrate to activate conductivity modulation and reduce the resistance of the n$^-$-type semiconductor substrate. A CSTBT (Carrier Stored Trench Gate Bipolar Transistor), an IEGT (Injection Enhanced Gate Transistor), etc. are known as devices having reduced on-voltage of an IGBT.

In a CSTBT, an n-type layer called as a carrier stored layer is inserted just under a p-type base layer to form a potential barrier between the carrier stored layer and the n$^-$-type semiconductor substrate. Therefore, the holes from the back surface are more likely to be stored. Thus, the resistance of the n$^-$-type semiconductor substrate can be reduced.

The concentration of the p-type base layer determines a threshold voltage. However, since the concentration of the p-type base layer tends to be fluctuated by the influence of the carrier stored layer, the threshold voltage tends to vary. In order to reduce the variation in the threshold voltage, it is sufficient to lower the concentration of the carrier stored layer near the p-type base layer (see FIG. 2D of JP 2004-22941A, for example).

SUMMARY

However, there has been a problem that even when a carrier stored layer having such a concentration distribution is tried to be formed by normal phosphorus implantation and thermal diffusion, it is difficult to control the implantation of impurities.

The present invention has been implemented to solve the problem as described above, and it is an object of the present invention to provide a semiconductor device that is capable of reducing variation in threshold voltage while lowering an on-voltage and can be easily manufactured, a power conversion device, and a method of manufacturing a semiconductor device.

According to the present invention, a semiconductor device includes: an n-type semiconductor substrate; a p-type base layer formed on a surface of the n-type semiconductor substrate; an n-type emitter layer formed on the p-type base layer, a trench gate penetrating through the p-type base layer and the n-type emitter layer, an n-type carrier stored layer formed between the n-type semiconductor substrate and the p-type base layer and having a higher concentration than that of the n-type semiconductor substrate; and a p-type collector layer formed on a back surface of the n-type semiconductor substrate, wherein with respect to the n-type carrier stored layer, a concentration gradient directing from a position of a peak concentration to the back surface side of the n-type semiconductor substrate is larger than a concentration gradient directing from the position of the peak concentration to the p-type base layer, and a proton is implanted in the n-type carrier stored layer.

In the present invention, with respect to the n-type carrier stored layer, the concentration gradient directing from the position of the peak concentration to the n-type semiconductor substrate is larger than the concentration gradient directing from the position of the peak concentration to the p-type base layer. Accordingly, the concentration of the carrier stored layer is sufficiently low near the p-type base layer, and does not greatly offset the concentration of the p-type base layer, thus variation in threshold voltage can be reduced. In addition, since the concentration of the carrier stored layer increases near the n-type semiconductor substrate, the on-voltage can be lowered. The carrier stored layer having such a concentration distribution can be easily formed by implanting protons as impurities.

Other and further objects, features and advantages of the invention will appear more fully from the following description.

DESCRIPTION OF EMBODIMENTS

A semiconductor device, a power conversion device, and a method of manufacturing a semiconductor device according to the embodiments of the present invention will be described with reference to the drawings. The same components will be denoted by the same symbols, and the repeated description thereof may be omitted.

First Embodiment

Figure 1:
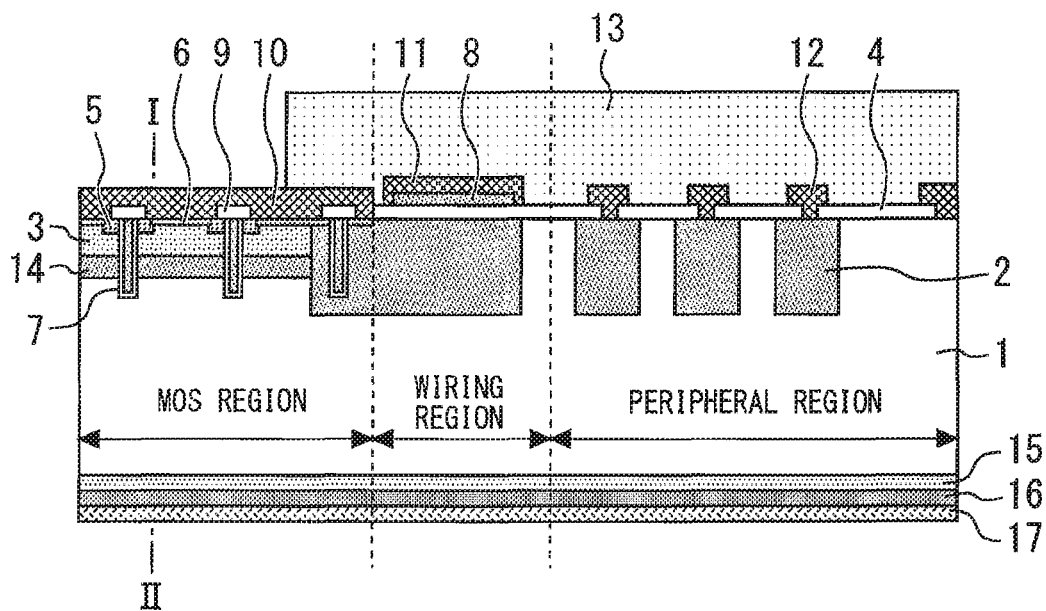
FIG. 1 is a cross-sectional view showing a semiconductor device according to a first embodiment.

FIG. 1 is a cross-sectional view showing a semiconductor device according to a first embodiment. The semiconductor device is a CSTBT. An n⁻-type semiconductor substrate 1 includes a MOS region having a transistor structure formed therein, a peripheral region arranged on the outer periphery of the MOS region for maintaining a withstand voltage, and a wiring region arranged between the MOS region and the peripheral region.

P-type well layers 2 are formed on the surface of the n⁻-type semiconductor substrate 1 in the peripheral region and the wiring region to maintain the withstand voltage. A p-type base layer 3 is formed on the surface of the n⁻-type semiconductor substrate 1 in the MOS region. The p-type well layers 2 are deeper than the p-type base layer 3. A thick oxide film 4 is formed on the substrate in the peripheral region and the wiring region.

An n⁺-type emitter layer 5 and a p⁺-type contact layer 6 are formed on the p-type base layer 3. Trench gates 7 penetrate through the p-type base layer 3 and the n⁺-type emitter layer 5. The trench gate 7 is configured so that a gate electrode of polysilicon or the like is buried in the trench via a gate insulating film. A collector-emitter saturation voltage Vce (sat) decreases as the trench gates 7 are deeper. However, when the trench gates 7 are excessively deep, it causes increase of the degree of difficulty in manufacturing and decrease of the yield. Therefore, the depths of the trench gates 7 are set to about 4 to 7 μm. A gate wire 8 of polysilicon or the like connected to the trench gates 7 is formed on an oxide film 4 in the wiring region. Interlayer insulating films 9 are formed on the trench gates 7.

An emitter electrode 10 is connected to the n⁺-type emitter layer 5 and the p⁺-type contact layer 6. A gate wire 11 is formed on the gate wire 8. An electrode 12 is connected to the p-type well layers 2 via openings of the oxide film 4 in the peripheral region. The emitter electrode 10, the gate wire 11 and the electrode 12 are made of Al, and the thicknesses thereof are set such that the device is not damaged by wire bonding, specifically, the thicknesses are set to 3 to 6 μm. Polyimide 13 is formed as a surface protective film on the surface of the n-type semiconductor substrate 1 in the peripheral region and the wiring region. Polyimide 13 is not formed in the MOS region.

An n-type carrier stored layer 14 having a higher concentration than the n⁻-type semiconductor substrate 1 is formed between the n⁻-type semiconductor substrate 1 and the p-type base layer 3. Protons are implanted in the n-type carrier stored layer 14. The n-type carrier stored layer 14 is formed in the MOS region, but not formed in the peripheral region and the wiring region. An n⁺-type buffer layer 15 and a p-type collector layer 16 are formed on the back surface of the n⁻-type semiconductor substrate 1. A collector electrode 17 is connected to the p-type collector layer 16.

Figure 2:
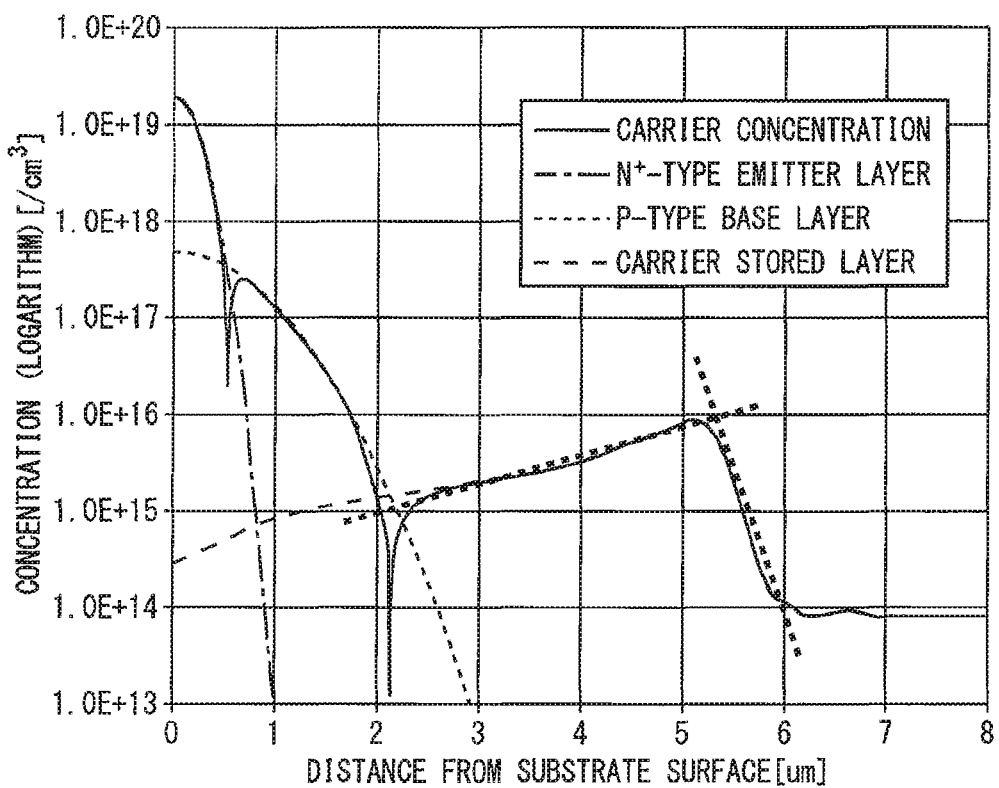
FIG. 2 is a diagram showing carrier concentration profiles along line I-II in FIG. 1.

FIG. 2 is a diagram showing carrier concentration profiles along line I-II in FIG. 1. The concentration is higher in the order of the n⁺-type emitter layer 5, the p-type base layer 3, and the n-type carrier stored layer 14. With respect to the n-type carrier stored layer 14, the concentration gradient directing from the position of a peak concentration to the back surface side of the n⁻-type semiconductor substrate 1 is larger than the concentration gradient directing from the position of the peak concentration to the p-type base layer 3.

Figure 3:
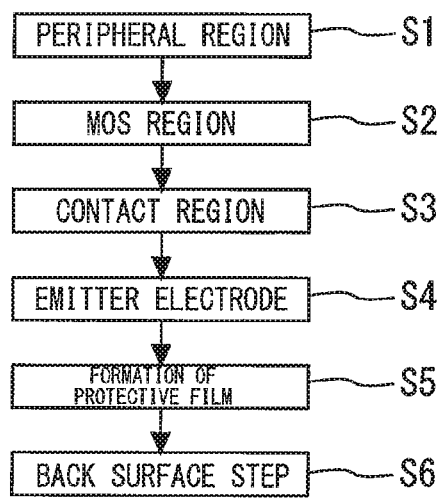
FIG. 3 is a flowchart showing the semiconductor device manufacturing method according to the embodiment.

Subsequently, a semiconductor device manufacturing method according to an embodiment will be described. FIG. 3 is a flowchart showing the semiconductor device manufacturing method according to the embodiment. FIGS. 4 to 11 are cross-sectional views showing the semiconductor device manufacturing device according to the first embodiment.

Figure 4:
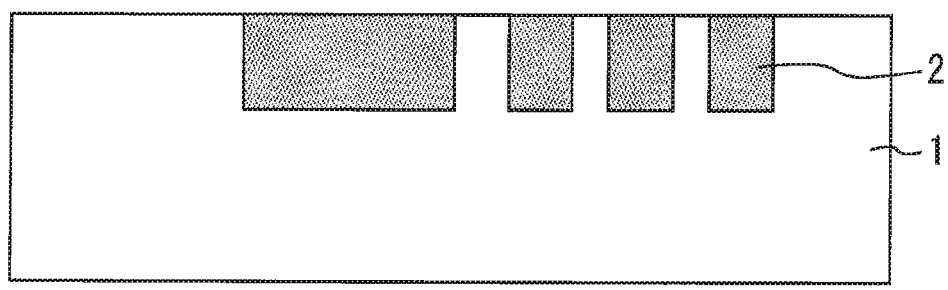
FIGS. 4 to 11 are cross-sectional views showing the semiconductor device manufacturing device according to the first embodiment.

First, as shown in FIG. 4, the p-type well layers 2 are selectively formed in the peripheral region and the wiring region by a photolithography technique and a heat treatment at a high temperature of 1100° C. or the like for a long time (step S1).

Figure 5:
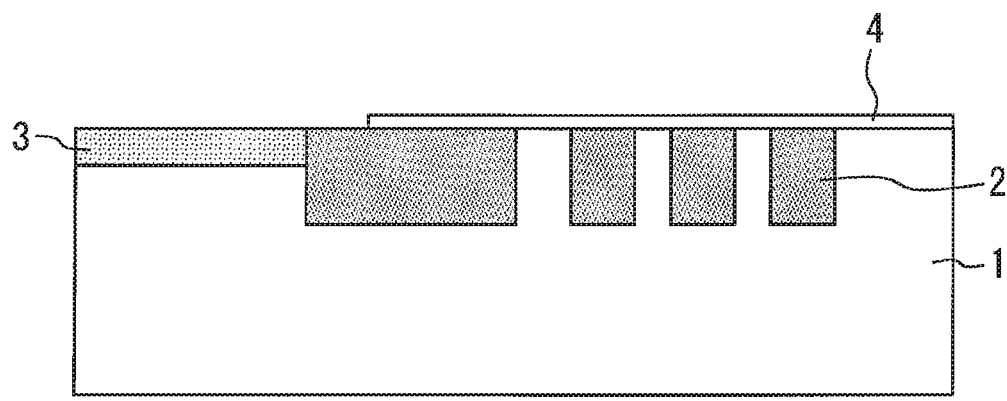
Figure 6:
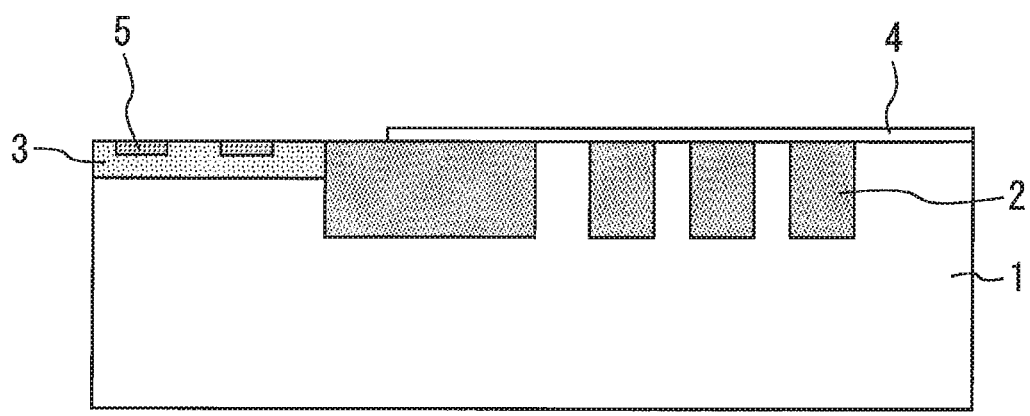
Figure 7:
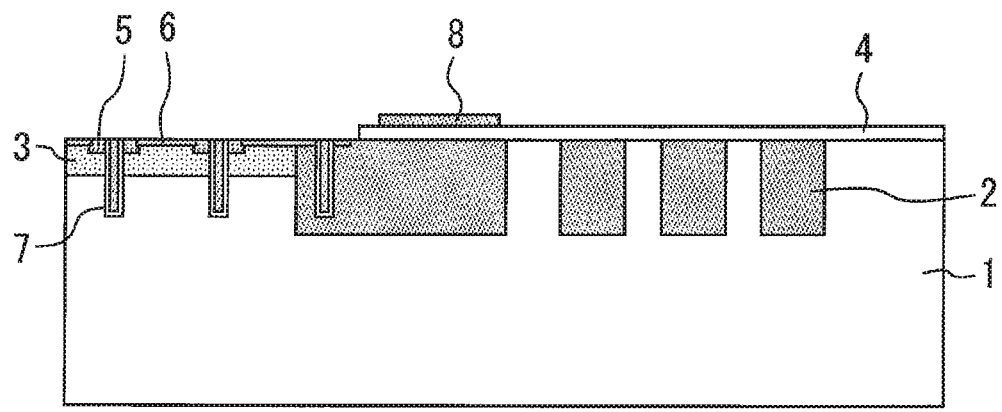

Next, as shown in FIG. 5, the oxide film 4 is formed on the entire surface of the substrate. The oxide film 4 is removed in the MOS region. The p-type base layer 3 is formed on the surface of the n⁻-type semiconductor substrate 1. Next, as shown in FIG. 6, the n⁺-type emitter layer 5 is formed on the p-type base layer 3. Next, as shown in FIG. 7, the trench gates 7 penetrating through the p-type base layer 3 and the n⁺-type emitter layer 5 are formed (step S2).

Figure 8:
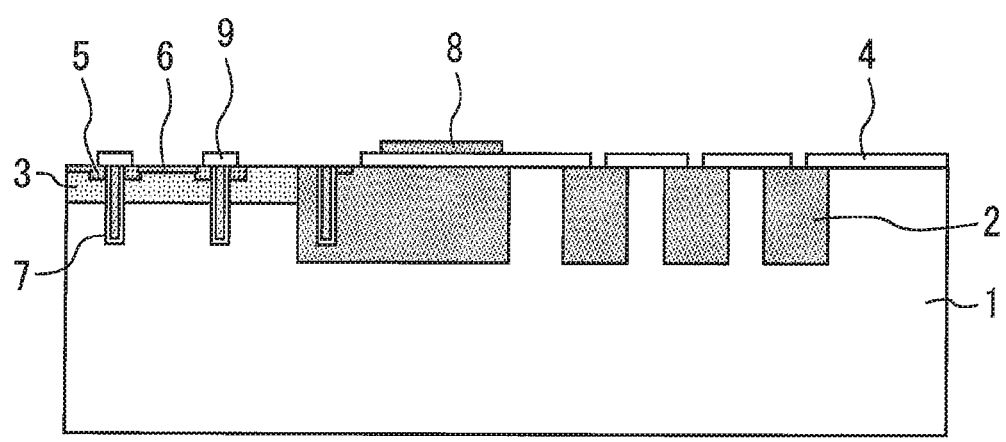
Figure 9:
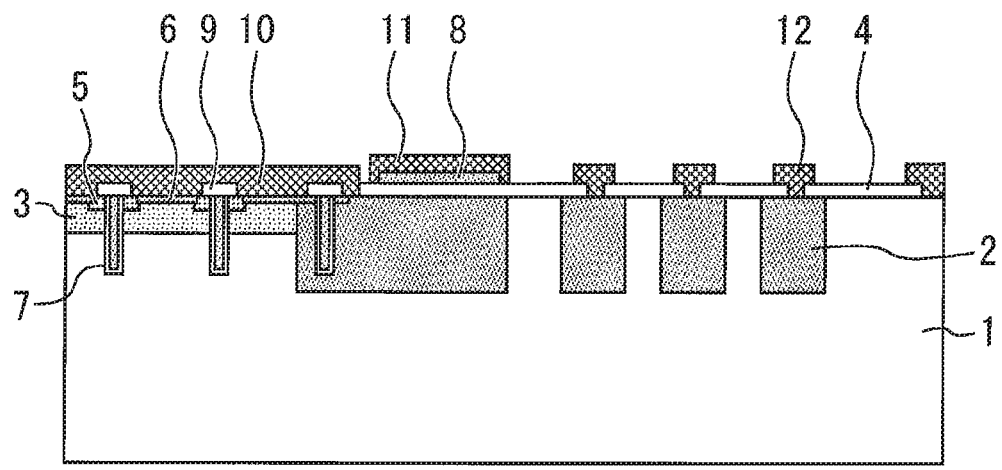
Figure 10:
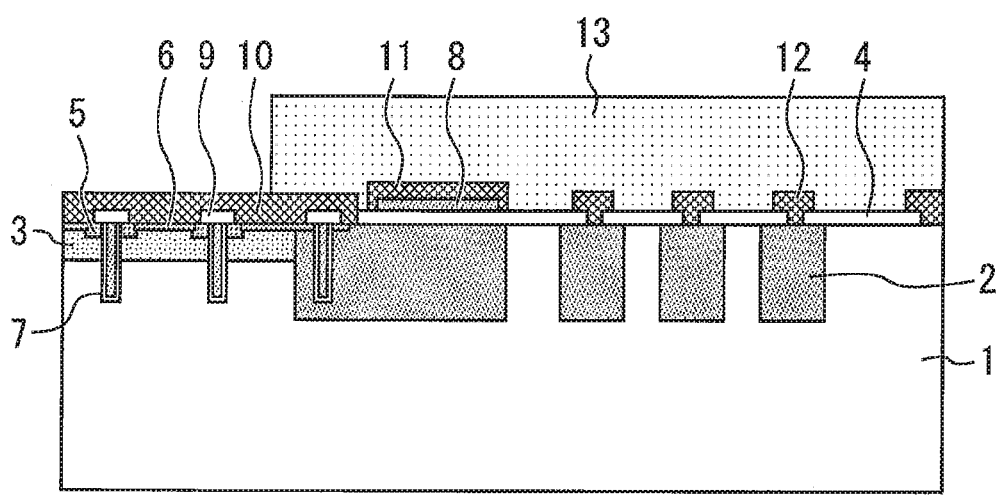
Figure 11:
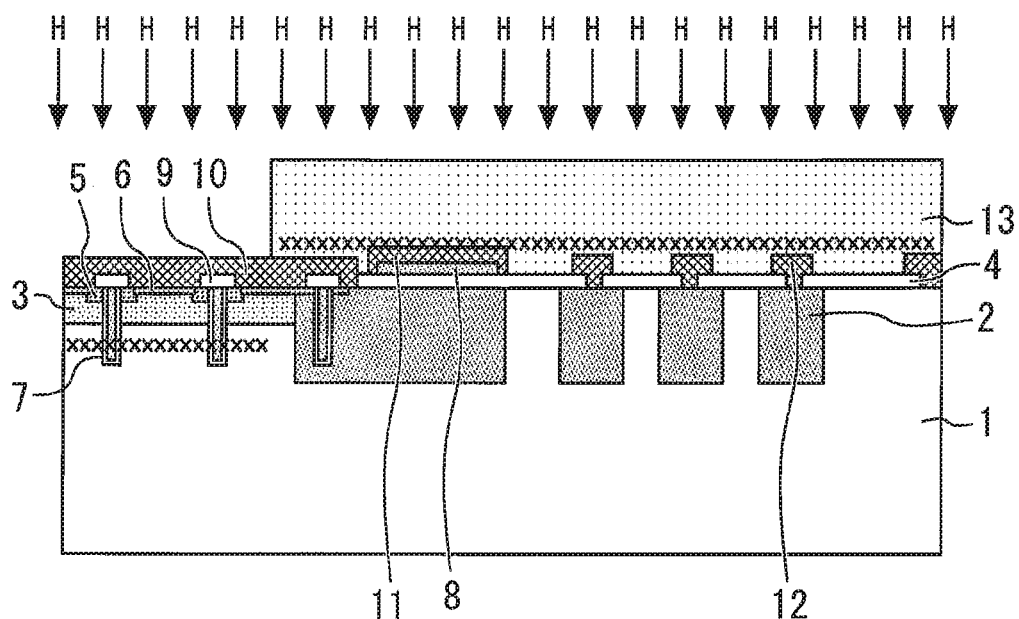

Next, as shown in FIG. 8, the interlayer insulating film 9 is formed on the entire surface of the substrate. The oxide film 4 and the interlayer insulating film 9 are selectively removed by the photolithography technique to form a contact region (step S3). Next, as shown in FIG. 9, the emitter electrode 10 is formed (step S4). Next, as shown in FIG. 10, polyimide 13 is formed as a surface protective film in the peripheral region and the wiring region (step S5). Next, as shown in FIG. 11, protons are selectively implanted into the substrate surface only in the MOS region by using the polyimide 13 as a mask. The symbol "x" in FIG. 11 represents the stop position of protons. Next, a heat treatment at about 350 to 400° C. is performed to form the n-type carrier stored layer 14. After these surface steps, a p-type collector layer 16 and a collector electrode 17 are formed as a back surface step (step S6).

Here, when a heat treatment is performed in activation of the n⁺-type emitter layer 5, formation of the gate oxide film or the like after the n-type carrier stored layer 14 is formed, variation in depth of each diffusion layer or extraction and segregation of boron or phosphorus to the gate oxide film occur. Thus, the threshold voltage varies. Therefore, according to the present embodiment, the n-type carrier stored layer 14 is formed after the p-type base layer and the trench gates 7 are formed. As a result, the variation of the threshold voltage can be suppressed.

When the n-type carrier stored layer 14 is formed before formation of the surface structure such as the emitter electrode 10 and polyimide 13, it is necessary to selectively implant protons into the MOS region by using photolithography. After the formation of the surface structure such as the emitter electrode 10 and polyimide 13, protons can be implanted into only the MOS region without photolithography by appropriately adjusting the thicknesses of the emitter electrode 10 and polyimide 13.

When protons are implanted into the peripheral region, there is a possibility that the p-type well layers 2 are offset by turning protons to donors and the withstand voltage is lowered. On the other hand, it is also possible to selectively implant protons into only the MOS region by using the photolithography technique to form the n-type carrier stored layer 14. However, this method increases the manufacturing cost. Therefore, protons are selectively implanted into only the MOS region by using, as a mask, polyimide 13 formed in the peripheral region for surface protection. As a result, protons can be prevented from entering the peripheral region, and thus it is possible to prevent decrease of the withstand voltage.

Figure 12:
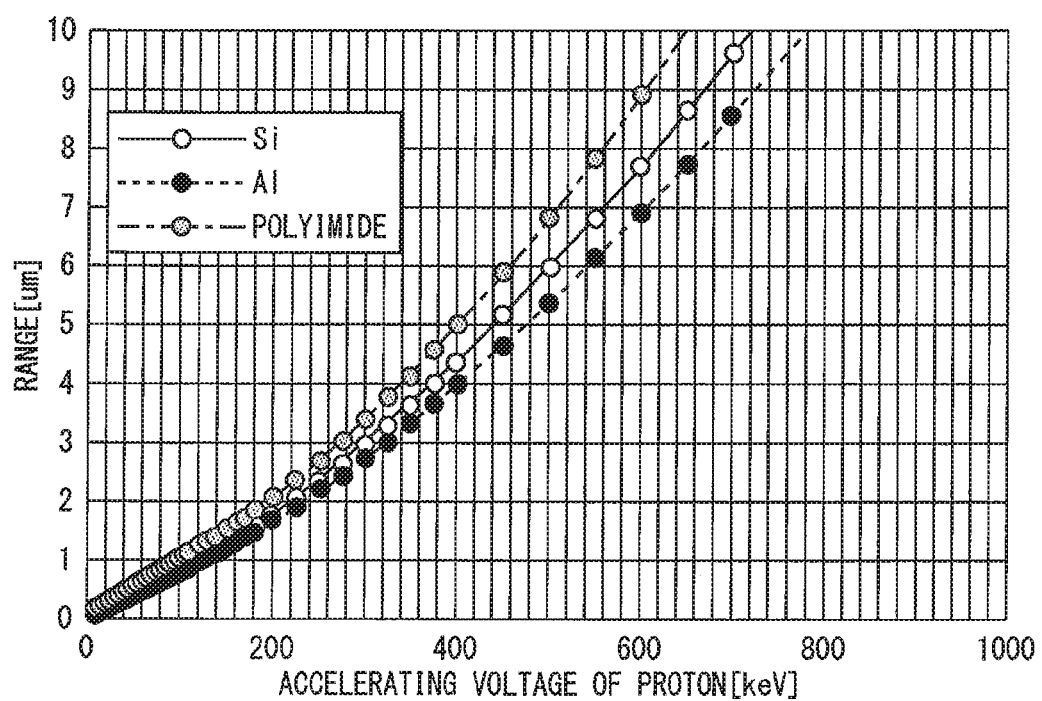
FIG. 12 is a graph showing a simulation result of the relationship between the accelerating voltage of protons and the range of the protons in Si, Al, and polyimide.

FIG. 12 is a graph showing a simulation result of the relationship between the accelerating voltage of protons and the range of the protons in Si, Al, and polyimide. Simulation is performed by using Stopping/Range Tables of software SRIM-2008. From this result, it can be seen that it is better to implant protons at an accelerating voltage of 600 to 1100 keV when protons are implanted at a depth of about 3 to 6 μm which is slightly shallower than the trench gates 7. In this case, in order to prevent protons from entering the peripheral region, it is required to set the film thickness of the polyimide 13 in the range from 3 to 7 μm.

The process turning the protons to donors is performed by a heat treatment at 350 to 450° C. With this level of heat treatment, diffusion of impurities such as boron, phosphorus or arsenic implanted in the other diffusion layers does not occur, so Vth variation hardly occurs.

Figure 13:
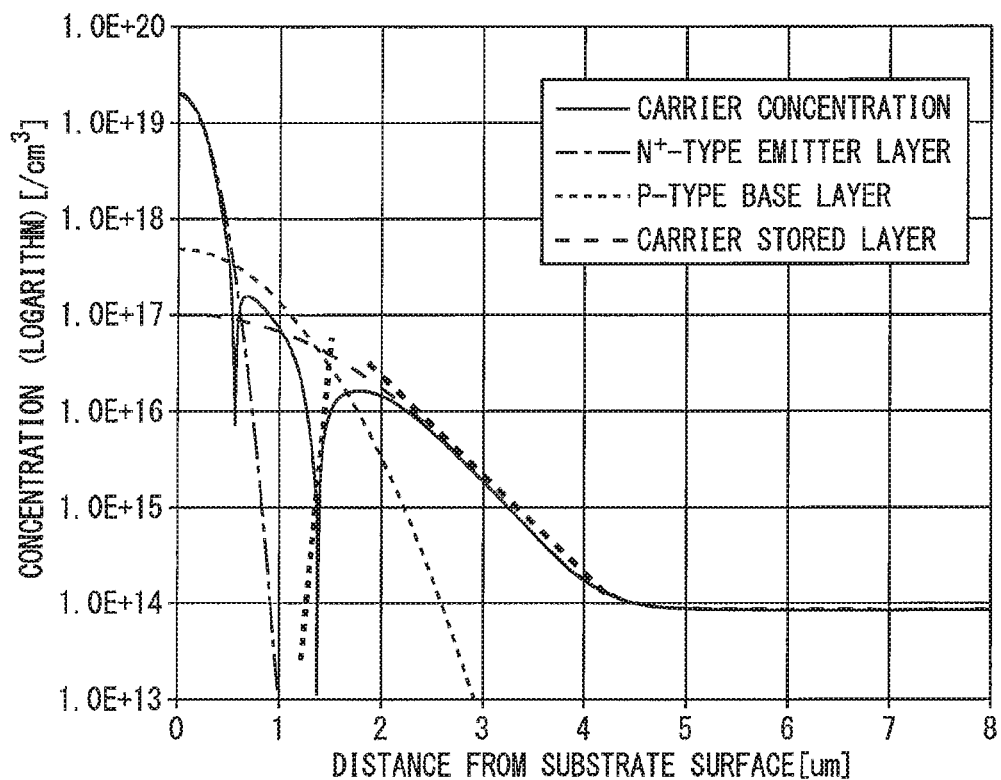
FIG. 13 is a diagram showing carrier concentration profiles of the semiconductor device according to the comparative example.

Subsequently, the effect of the present embodiment will be described in comparison with a comparative example. FIG. 13 is a diagram showing carrier concentration profiles of the semiconductor device according to the comparative example. In the comparative example, the carrier concentration of the n-type carrier stored layer 14 increases near the p-type base layer 3.

Figure 14:
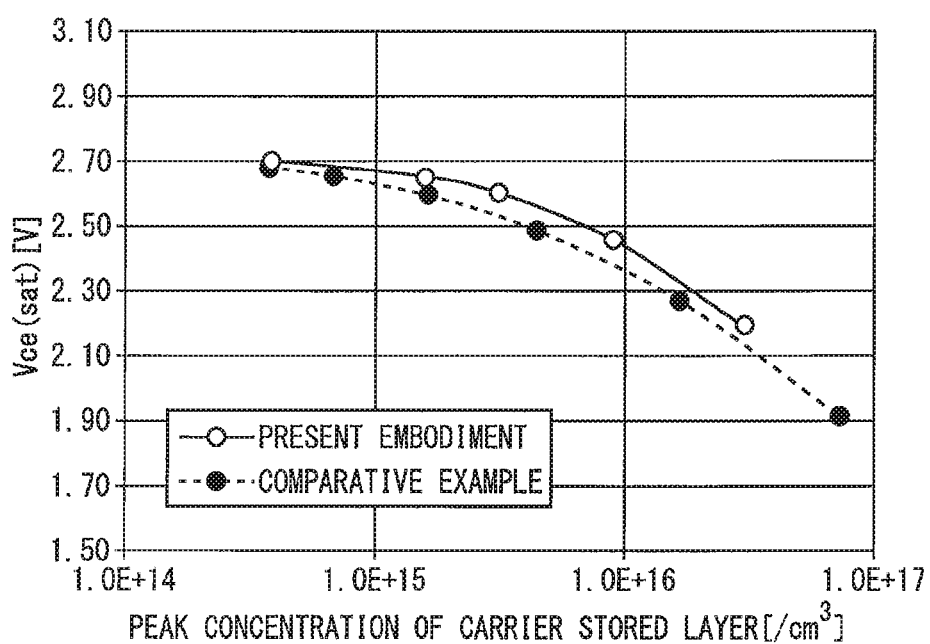
FIG. 14 is a diagram showing the relationship between the peak concentration of the carrier stored layer and Vce (sat) in the present embodiment and the comparative example.

FIG. 14 is a diagram showing the relationship between the peak concentration of the carrier stored layer and Vce (sat) in the present embodiment and the comparative example. In both the present embodiment and the comparative example, the carrier storage effect is higher as the peak concentration is higher. Thus, Vce (sat) decreases. Vce (sat) represents the on-voltage of the IGBT.

Figure 15:
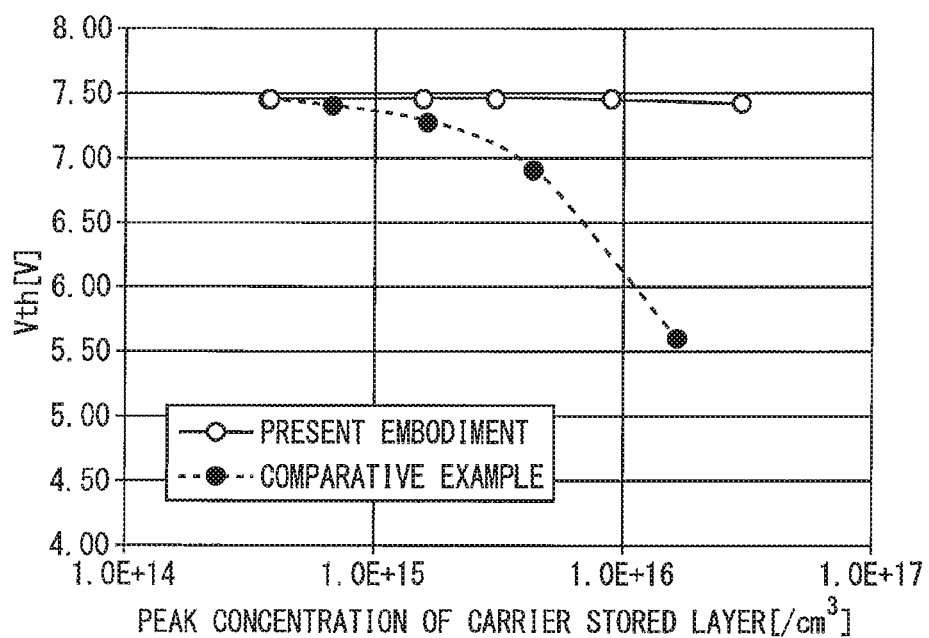
FIG. 15 is a diagram showing the relationship between the peak concentration of the carrier stored layer and the threshold voltage Vth in the embodiment and the comparative example.

FIG. 15 is a diagram showing the relationship between the peak concentration of the carrier stored layer and the threshold voltage Vth in the embodiment and the comparative example. In the comparative example, as the concentration of the n-type carrier stored layer 14 increases, the concentration of the effective p-type base layer 3 decreases, so the threshold voltage decreases. Conversely, as the concentration of the n-type carrier stored layer 14 decreases, the threshold voltage increases. Accordingly, in the comparative example, since the threshold voltage varies with respect to the variation in the concentration of the n-type carrier stored layer 14, the saturation current and the short-circuit tolerance of the IGBT fluctuate. Thus, the quality of products is deteriorated. When the impurities of the n-type carrier stored layer 14 are deeply implanted, the impurities do not interfere with the p-type base layer 3. However, when the impurities are implanted at a deeper position than the trench gates, the withstand voltage decreases. On the other hand, in the present embodiment, the sensitivity of the threshold voltage Vth to the unevenness of the concentration of the n-type carrier stored layer 14 is dull.

As described above, in the present embodiment, with respect to the n-type carrier stored layer 14, the concentration gradient directing from the position of the peak concentration to the n⁻-type semiconductor substrate 1 is larger than the concentration gradient directing from the position of the peak concentration to the p-type base layer 3. Accordingly, the concentration of the n-type carrier stored layer 14 is sufficiently low near the p-type base layer 3, and does not greatly offset the concentration of the p-type base layer 3. Thus, variation in threshold voltage can be reduced. As a result, the on-voltage does not fluctuate even when the implantation amount fluctuates in manufacturing. In addition, since the concentration of the n-type carrier stored layer 14 increases near the n⁻-type semiconductor substrate 1, the on-voltage can be lowered.

The n-type carrier stored layer 14 having such a concentration distribution can be easily formed by implanting protons as impurities. By performing the heat treatment after implanting protons, Si crystal defects bond to oxygen atoms in a proton passing region, donor formation occurs, and a broad profile is formed. On the other hand, since no crystal defect is formed on the n⁻-type semiconductor substrate 1 side from the position of the peak concentration, even when protons diffuse, donor formation is not accelerated. Furthermore, since protons which are light elements have a large range, it is possible to implant protons deeply in the substrate with low energy by using a general ion implantation apparatus. As a result, the n-type carrier stored layer 14 having the above concentration gradient can be easily formed.

In addition, when the n-type carrier stored layer 14 is deeper than the trench gate 7, it is difficult to be depleted, and the electric field in the vicinity thereof becomes high. Thus, the withstand voltage decreases. In contrast, in the present embodiment, the concentration of the n-type carrier stored layer 14 steeply attenuates toward the n⁻-type semiconductor substrate 1, and the depth of the n-type carrier stored layer 14 is shallower than that of the trench gate 7. As a result, the decrease of the withstand voltage can be prevented.

The n⁻-type semiconductor substrate 1 is not limited to a substrate formed of silicon, but instead may be formed of a wide-bandgap semiconductor having a bandgap wider than that of silicon. The wide-bandgap semiconductor is, for example, a silicon carbide, a gallium-nitride-based material, or diamond. A semiconductor device formed of such a wide-bandgap semiconductor has a high voltage resistance and a high allowable current density, and thus can be miniaturized. The use of such a miniaturized semiconductor device enables the miniaturization and high integration of the semiconductor module in which the semiconductor device is incorporated. Further, since the semiconductor device has a high heat resistance, a radiation fin of a heatsink can be miniaturized and a water-cooled part can be air-cooled, which leads to further miniaturization of the semiconductor module. Further, since the semiconductor device has a low power loss and a high efficiency, a highly efficient semiconductor module can be achieved.

Second Embodiment

In this embodiment, the semiconductor device according to the first embodiment described above is applied to an electric power conversion device. The electric power conversion device is, for example, an inverter device, a converter device, a servo amplifier, or a power supply unit. Although the present invention is not limited to a specific electric power conversion device, a case where the present invention is applied to a three-phase inverter will be described below.

Figure 16:
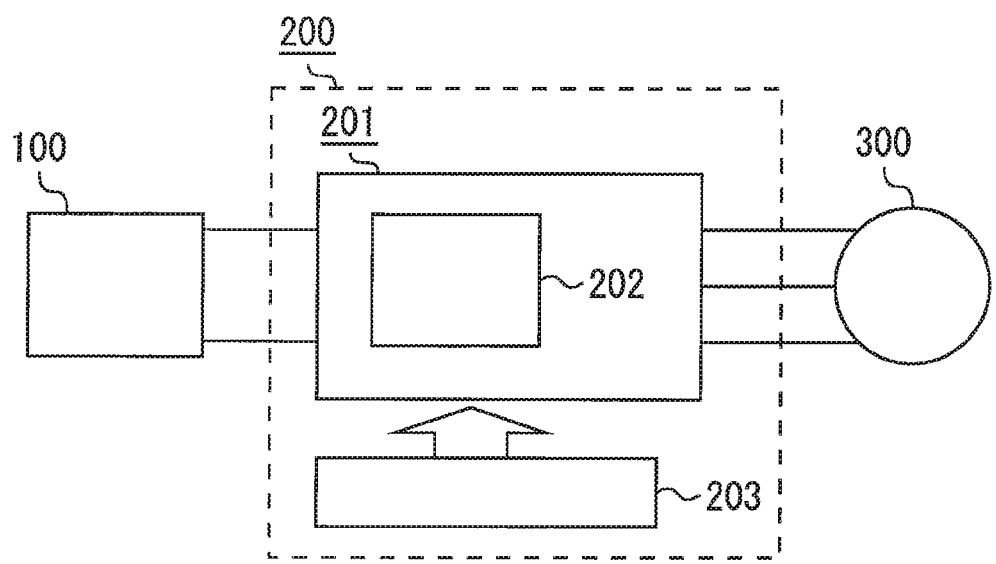
FIG. 16 is a block diagram illustrating a configuration of an electric power conversion system to which the electric power conversion device according to the second embodiment is applied.

FIG. 16 is a block diagram illustrating a configuration of an electric power conversion system to which the electric power conversion device according to the second embodiment is applied. This electric power conversion system includes a power supply 100, an electric power conversion device 200, and a load 300. The power supply 100 is a DC power supply and supplies DC power to the electric power conversion device 200. The power supply 100 can be composed of various components. For example, the power supply 100 can be composed of a DC system, a solar cell, or a storage battery, or may be composed of a rectifier or an AC/DC converter, which is connected to an AC system. Alternatively, the power supply 100 may be composed of a DC/DC converter that converts DC power output from a DC system to predetermined power.

The electric power conversion device 200 is a three-phase inverter connected to a node between the power supply 100 and the load 300, converts DC power supplied from the power supply 100 into AC power, and supplies the AC power to the load 300. The electric power conversion device 200 includes a main conversion circuit 201 that converts DC power into AC power and outputs the AC power, and a control circuit 203 that outputs a control signal for controlling the main conversion circuit 201 to the main conversion circuit 201.

The load 300 is a three-phase electric motor that is driven by AC power supplied from the electric power conversion device 200. The load 300 is not limited to a specific application. The load is used as an electric motor mounted on various electric devices, such as an electric motor for, for example, a hybrid vehicle, an electric vehicle, a railroad vehicle, an elevator, or an air-conditioner.

The electric power conversion device 200 will be described in detail below. The main conversion circuit 201 includes a switching device and a reflux diode (not illustrated). When the switching device is switched, the main conversion circuit 201 converts DC power supplied from the power supply 100 into AC power, and supplies the AC power to the load 300. The main conversion circuit 201 may have various types of specific circuit configurations. The main conversion circuit 201 according to this embodiment is a two-level three-phase full-bridge circuit, which can be composed of six switching devices and six reflux diodes connected in antiparallel with the respective switching devices. Each switching device and each reflux diode of the main conversion circuit 201 are composed of a semiconductor device 202 corresponding to any one of the first to fourth embodiments described above. Every two switching devices of the six switching devices are connected in series and constitute a vertical arm. Each vertical arm constitutes each phase (U-phase, V-phase, W-phase) of the full-bridge circuit. Output terminals of each vertical arm, i.e., three output terminals of the main conversion circuit 201, are connected to the load 300.

Further, the main conversion circuit 201 includes a drive circuit (not illustrated) that drives each switching device. The drive circuit may be incorporated in the semiconductor device 202. Another drive circuit different from the semiconductor device 202 may be provided. The drive circuit generates a drive signal for driving each switching device of the main conversion circuit 201, and supplies the generated drive signal to a control electrode of each switching device of the main conversion circuit 201. Specifically, the drive circuit outputs, to the control electrode of each switching device, a drive signal for turning on each switching device and a drive signal for turning off each switching device, according to the control signal output from the control circuit 203, which is described later. When the ON-state of each switching device is maintained, the drive signal is a voltage signal (ON signal) having a voltage equal to or higher than a threshold voltage of the switching device. When the OFF-state of each switching device is maintained, the drive signal is a voltage signal (OFF signal) having a voltage equal to or lower than the threshold voltage of the switching device.

The control circuit 203 controls each switching device of the main conversion circuit 201 so as to supply a desired power to the load 300. Specifically, the control circuit 203 calculates a period (ON period), in which each switching device of the main conversion circuit 201 is in the ON state, based on the power to be supplied to the load 300. For example, the main conversion circuit 201 can be controlled by a PWM control for modulating the ON period of each switching device depending on the voltage to be output. Further, the control circuit 203 outputs a control command (control signal) to the drive circuit included in the main conversion circuit 201 so that the ON signal is output to each switching device to be turned on and an OFF signal is output to each switching device to be turned off at each point. The drive circuit outputs the ON signal or OFF signal, as the drive signal, to the control electrode of each switching device according to the control signal.

In the electric power conversion device according to this embodiment, the semiconductor device according to the first embodiment is applied as the semiconductor device 202. Accordingly, it is possible to reduce variation in threshold voltage while lowering an on-voltage and the electric power conversion device can be easily manufactured.

While this embodiment illustrates an example in which the present invention is applied to a two-level three-phase inverter, the present invention is not limited to this and can be applied to various electric power conversion devices. While this embodiment illustrates a two-level electric power conversion device, the present invention can also be applied to a three-level or multi-level electric power conversion device. When power is supplied to a single-phase load, the present invention may be applied to a single-phase inverter. The present invention can also be applied to a DC/DC converter or an AC/DC converter when power is supplied to a DC load or the like.

Further, in the electric power conversion device to which the present invention is applied, the above-mentioned load is not limited to an electric motor. For example, the load may also be used as a power supply device for an electric discharge machine, a laser beam machine, an induction heating cooker, or a non-contact device power feeding system. More alternatively, the load may be used as a power conditioner for a photovoltaic power generating system, an electricity storage system, or the like.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2018-015163, filed on Jan. 31, 2018 including specification, claims, drawings and summary, on which the Convention priority of the present application is based, is incorporated herein by reference in its entirety.

The invention claimed is:

1. A semiconductor device comprising:
an n-type semiconductor substrate;
a p-type base layer formed on a surface of the n-type semiconductor substrate;
an n-type emitter layer formed on the p-type base layer;
a trench gate penetrating through the p-type base layer and the n-type emitter layer;
an n-type carrier stored layer formed between the n-type semiconductor substrate and the p-type base layer and having a higher concentration than that of the n-type semiconductor substrate; and a p-type collector layer formed on a back surface of the n-type semiconductor substrate, wherein with respect to the n-type carrier stored layer, a concentration gradient directing from a position of a peak concentration to the back surface of the n-type semiconductor substrate is larger than a concentration gradient directing from the position of the peak concentration to the p-type base layer, and the concentration of the n-type carrier stored layer decreases from near the n-type semiconductor substrate to near the p-type base layer, and a proton is implanted in the n-type carrier stored layer as an impurity.

2. The semiconductor device according to claim 1, wherein a depth of the n-type carrier stored layer is shallower than that of the trench gate.

3. The semiconductor device according to claim 1, wherein the n-type semiconductor substrate includes the p-type base layer, the n-type emitter layer, a MOS region in which the trench gate is formed, and a peripheral region arranged on an outer periphery of the MOS region for maintaining a withstand voltage, and the n-type carrier stored layer is formed in the MOS region, but not formed in the peripheral region.

4. The semiconductor device according to claim 2, wherein the n-type semiconductor substrate includes the p-type base layer, the n-type emitter layer, a MOS region in which the trench gate is formed, and a peripheral region arranged on an outer periphery of the MOS region for maintaining a withstand voltage, and the n-type carrier stored layer is formed in the MOS region, but not formed in the peripheral region.

5. The semiconductor device according to claim 1, wherein the n-type semiconductor substrate is made of a wide-band-gap semiconductor.

6. The semiconductor device according to claim 2, wherein the n-type semiconductor substrate is made of a wide-band-gap semiconductor.

7. The semiconductor device according to claim 3, wherein the n-type semiconductor substrate is made of a wide-band-gap semiconductor.

8. The semiconductor device according to claim 4, wherein the n-type semiconductor substrate is made of a wide-band-gap semiconductor.

9. An electric power conversion device comprising:

a main conversion circuit including a semiconductor device, converting input power and outputting converted power; and a control circuit outputting a control signal for controlling the main conversion circuit to the main conversion circuit, wherein the semiconductor device includes:

an n-type semiconductor substrate;

a p-type base layer formed on a surface of the n-type semiconductor substrate;

an n-type emitter layer formed on the p-type base layer;

a trench gate penetrating through the p-type base layer and the n-type emitter layer;

an n-type carrier stored layer formed between the n-type semiconductor substrate and the p-type base layer and having a higher concentration than that of the n-type semiconductor substrate; and a p-type collector layer formed on a back surface of the n-type semiconductor substrate, wherein with respect to the n-type carrier stored layer, a concentration gradient directing from a position of a peak concentration to the back surface of the n-type semiconductor substrate is larger than a concentration gradient directing from the position of the peak concentration to the p-type base layer and the concentration of the n-type carrier stored layer decreases from near the n-type semiconductor substrate to near the p-type base layer, and a proton is implanted in the n-type carrier stored layer as an impurity.

* * * * *